(12) United States Patent
Choi et al.

(10) Patent No.: US 8,752,580 B2
(45) Date of Patent: Jun. 17, 2014

(54) VACUUM CHAMBER FOR PROCESSING SUBSTRATE AND APPARATUS INCLUDING THE SAME

(75) Inventors: Hyun-Bum Choi, Gyeonggi-do (KR); An-Ki Cha, Gyeonggi-do (KR)

(73) Assignee: Jusung Engineering Co., Ltd. (KR)

( * ) Notice: Subject to any disclaimer, the term of this patent is extended or adjusted under 35 U.S.C. 154(b) by 1394 days.

(21) Appl. No.: 12/489,432

(22) Filed: Jun. 23, 2009

(65) Prior Publication Data
US 2009/0317215 A1   Dec. 24, 2009

(30) Foreign Application Priority Data
Jun. 24, 2008   (KR) ................ 10-2008-0059527

(51) Int. Cl.
*H01L 21/67* (2006.01)

(52) U.S. Cl.
USPC .......... 137/565.23; 165/56; 165/73; 165/168; 165/185; 414/217

(58) Field of Classification Search
USPC ......... 137/565.23; 165/56, 73, 168, 170, 185; 156/345.1; 220/215, 557, 581, 582, 220/678; 414/217, 221
See application file for complete search history.

(56) References Cited

U.S. PATENT DOCUMENTS

| | | | | |
|---|---|---|---|---|
| 3,339,785 | A * | 9/1967 | Nugent | 220/345.6 |
| 3,352,446 | A * | 11/1967 | Anderson et al. | 220/345.6 |
| 5,853,176 | A * | 12/1998 | Kiriyama | 277/312 |
| 5,902,088 | A * | 5/1999 | Fairbairn et al. | 414/217 |
| 6,109,345 | A * | 8/2000 | Giacomel | 165/185 |
| 6,182,851 | B1 * | 2/2001 | Donde | 220/582 |
| 6,609,877 | B1 * | 8/2003 | Ramsay | 414/217 |
| 6,916,399 | B1 * | 7/2005 | Rozenzon et al. | 156/345.37 |
| 7,492,598 | B2 * | 2/2009 | Narasimhan et al. | 165/185 |
| 8,033,769 | B2 * | 10/2011 | Gage et al. | 414/217 |
| 8,272,825 | B2 * | 9/2012 | Hofmeister et al. | 414/217 |
| 2001/0016157 | A1 * | 8/2001 | Sundar | 414/217 |
| 2002/0189840 | A1 * | 12/2002 | Ohta et al. | 174/68.1 |
| 2004/0151562 | A1 * | 8/2004 | Hofmeister et al. | 414/217 |
| 2006/0231027 | A1 * | 10/2006 | Iwabuchi | 118/719 |
| 2008/0145193 | A1 * | 6/2008 | Makino et al. | 414/217 |

* cited by examiner

*Primary Examiner* — John Rivell

(57) ABSTRACT

A vacuum chamber for processing a substrate includes: a chamber body; and a chamber lid combined with the chamber body, wherein the chamber lid comprises: a frame having a plurality of openings; and a plurality of plates combined with the plurality of openings.

19 Claims, 6 Drawing Sheets

VACUUM CHAMBER FOR PROCESSING SUBSTRATE AND APPARATUS INCLUDING THE SAME

This application claims the benefit of Korean Patent Application No. 2008-0059527, filed on Jun. 24, 2008, which is hereby incorporated by a reference in its entirety.

TECHNICAL FIELD

The present invention relates to a vacuum chamber for processing a substrate, and more particularly, to a vacuum chamber having a chamber lid and an apparatus including the vacuum chamber.

BACKGROUND

In general, a fabrication process for a semiconductor device such as a flat panel display device and a solar cell includes repetition of a step of depositing a thin film, a photolithographic step of patterning a photoresist (PR) layer and a step of etching the thin film for a pattern. The deposition step and the etch step may be performed in a chamber of an apparatus having a reaction space separated from exterior. For example, a cluster type apparatus including a load-lock chamber, a transfer chamber and a process chamber may be used for the deposition step and the etch step, and the load-lock chamber, the transfer chamber and the process chamber may have a vacuum state during the deposition step and the etch step. Specifically, since a substrate is inputted from an exterior having an atmospheric state into the load-lock chamber and the substrate is transferred from the load-lock chamber to the transfer chamber having a vacuum state, the load-lock chamber alternately have the atmospheric state and the vacuum state.

FIG. 1 is a view showing a cluster type apparatus according to the related art.

In FIG. 1, a cluster type apparatus 10 includes a substrate loader/unloader 18, a load-lock chamber 12, a transfer chamber 14 and a plurality of process chambers 16. A plurality of substrates 20 are inputted into the substrate loader/unloader 18 for a process, and the plurality of substrates 20 are outputted from the substrate loader/unloader 18 after finishing the process. The load-lock chamber 12 is disposed between the substrate loader/unloader 18 and the transfer chamber 14. Accordingly, the plurality of substrates 20 are transferred from the substrate loader/unloader 18 to the transfer chamber 14 through the load-lock chamber 12. The substrate loader/unloader 18 includes a first robot 24 for transferring the plurality of substrates 20 from the substrate loader/unloader 18 to the load-lock chamber 12, and the transfer chamber 14 includes a second robot 22 for transferring the plurality of substrates 20 from the load-lock chamber 12 to the plurality of process chambers 16.

FIG. 2 is an exploded perspective view showing a load-lock chamber of a cluster type apparatus according to the related art.

In FIG. 2, a load-lock chamber 12 includes a chamber body 28 and a chamber lid 29. The chamber body 28 includes first to fourth sidewalls 30, 32, 34 and 36. The first and second sidewalls 30 and 32 have first and second slot valves 31 and 33, respectively, for substrate transfer, and the third and fourth sidewalls 34 and 35 are disposed between the first and second sidewalls 30 and 32. As a result, the substrate 20 (of FIG. 1) is inputted from the substrate loader/unloader 18 (of FIG. 1) to the load-lock chamber 12 through the first slot valve 31, and the substrate 20 is outputted from the load-lock chamber 12 to the transfer chamber 14 (of FIG. 1) through the second slot valve 33. Each of third and fourth sidewalls 36 and 38 has a view port 38 for inspecting the inside of the load-lock chamber 12. The view port 38 may be opened for inspection and may be closed after inspection. The chamber body 28 and the chamber lid 29 may be formed of a metallic material such as aluminum (Al).

Further, a diffuser 40 is formed on one of the third and fourth sidewalls 36 and 38. The load-lock chamber 12 of a vacuum state is ventilated by a gas injected through the diffuser 40 to have an atmospheric state. For example, a nitrogen gas (N2) may be diffused into the load-lock chamber 12 through the diffuser 40. A vacuum pump (not shown) is connected to the load-lock chamber 12 for obtaining the vacuum state. In addition, a plurality of substrate supporters 42 spaced apart from each other are formed in the load-lock chamber 12. The substrate 20 is loaded on the plurality of substrate supporters 42 and arms of the second robot 22 of the transfer chamber 14 are inserted into the spaces between the substrate supporters 42. Accordingly, the substrate 20 is transferred from the load-lock chamber 12 to the transfer chamber 14 using the second robot 22 through the second slot valve 33. The plurality of substrate supporters 42 may include a heating means (not shown) for heating up the substrate 20.

The load-lock chamber 12 is evacuated for conversion from the atmospheric state to the vacuum state and is ventilated for conversion from the vacuum state to the atmospheric state. Accordingly, evacuation and ventilation are repeatedly performed for the load-lock chamber 12. In addition, the substrate 20 is heated up to have a process temperature in the load-lock chamber 12. Since the load-lock chamber 12 is formed of a metallic material such as aluminum (Al) having a relatively low strength, the chamber body 28 and the chamber lid 29 of the load-lock chamber 12 may be deformed due to the repetition of evacuation and ventilation under a relatively high temperature. As a result, the lifetime of the load-lock chamber 12 is reduced.

SUMMARY

Accordingly, the present invention is directed to a vacuum chamber for processing a substrate and an apparatus including the vacuum chamber that substantially obviate one or more of the problems due to limitations and disadvantages of the related art.

An object of the present invention is to provide a vacuum chamber where deformation is prevented due to an improved strength.

Another object of the present invention is to provide a chamber lid for a vacuum chamber including a frame and a plurality of plates.

Another object of the present invention is to provide a chamber lid for a vacuum chamber including a flow channel for cooling.

A vacuum chamber for processing a substrate includes: a chamber body; and a chamber lid combined with the chamber body, wherein the chamber lid comprises: a frame having a plurality of openings; and a plurality of plates combined with the plurality of openings.

BRIEF DESCRIPTION OF THE DRAWINGS

The accompanying drawings, which are included to provide a further understanding of the invention and are incorporated in and constitute a part of this specification, illustrate embodiments of the invention.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

Figure 1:
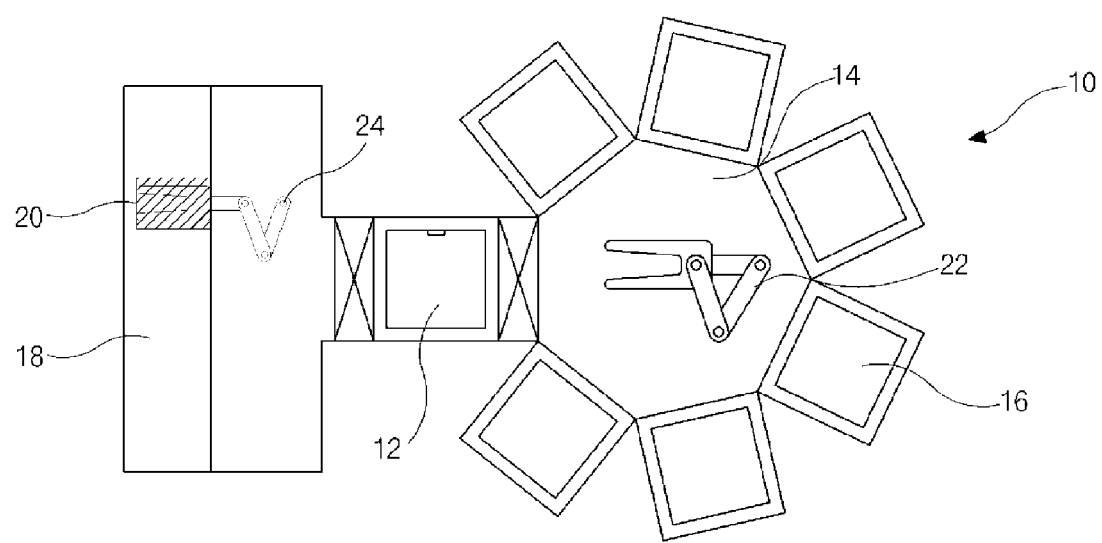
FIG. 1 is a view showing a cluster type apparatus according to the related art.
Figure 2:
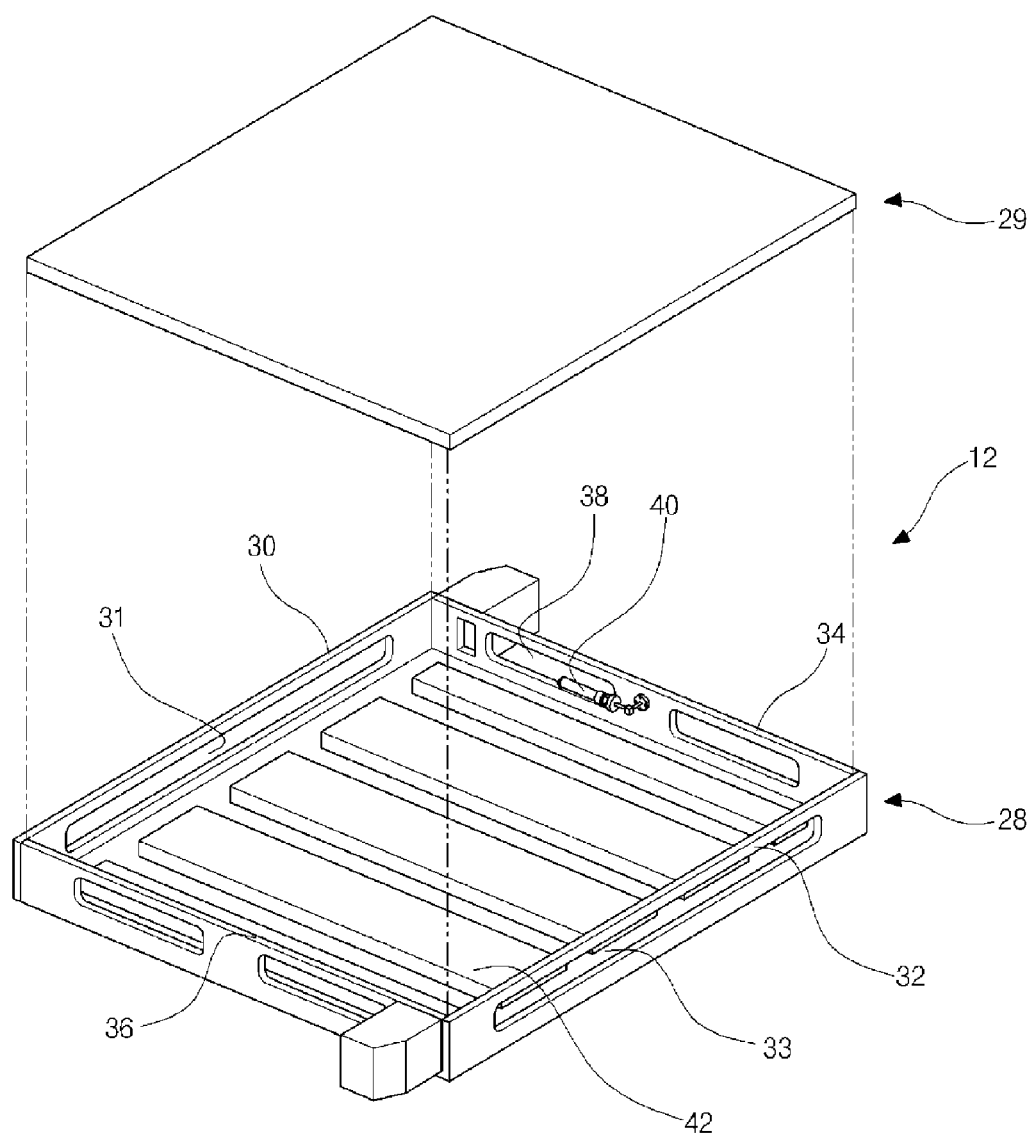
FIG. 2 is an exploded perspective view showing a load-lock chamber of a cluster type apparatus according to the related art.
Figure 3:
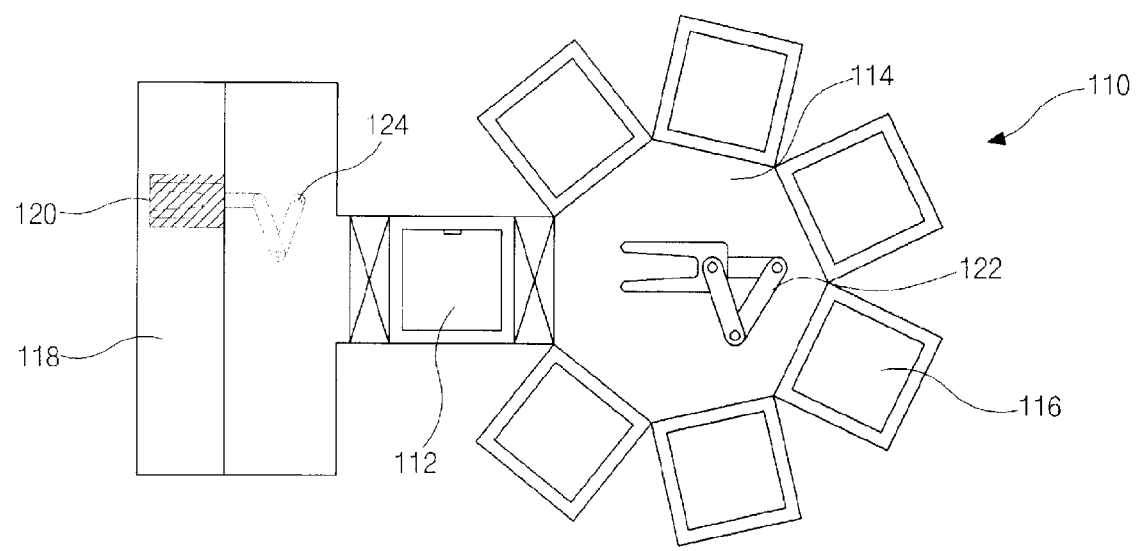
FIG. 3 is a view showing a cluster type apparatus according to an embodiment of the present invention.

FIG. 3 is a view showing a cluster type apparatus according to an embodiment of the present invention.

In FIG. 3, a cluster type apparatus 10 includes a substrate loader/unloader 118, a load-lock chamber 112, a transfer chamber 114 and a plurality of process chambers 116. A plurality of substrates 120 are inputted into the substrate loader/unloader 118 for a process, and the plurality of substrates 120 are outputted from the substrate loader/unloader 118 after finishing the process. The load-lock chamber 112 is disposed between the substrate loader/unloader 118 and the transfer chamber 114. Accordingly, the plurality of substrates 120 are transferred from the substrate loader/unloader 118 to the transfer chamber 114 through the load-lock chamber 112. The substrate loader/unloader 118 includes a first robot 124 for transferring the plurality of substrates 120 from the substrate loader/unloader 118 to the load-lock chamber 112, and the transfer chamber 114 includes a second robot 122 for transferring the plurality of substrates 120 from the load-lock chamber 112 to the plurality of process chambers 116.

Figure 4:
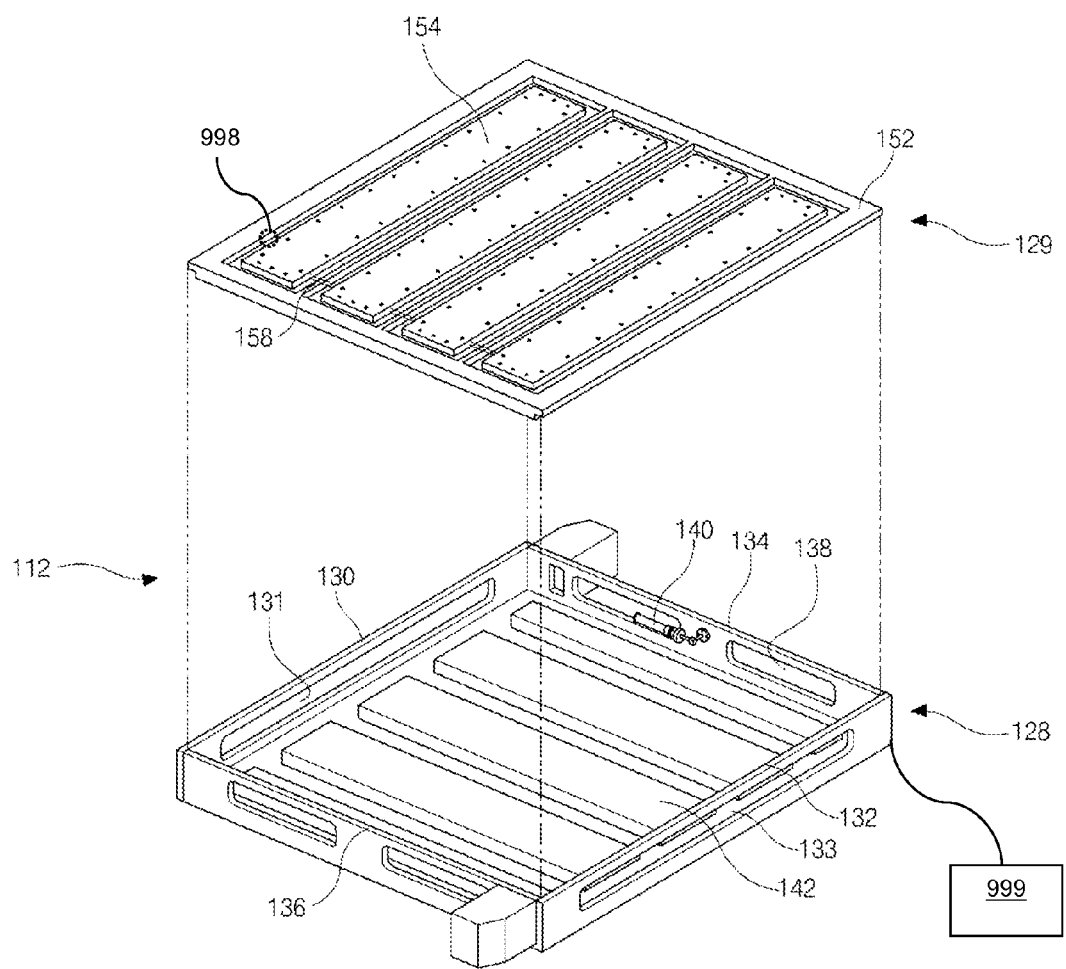
FIG. 4 is an exploded perspective view showing a load-lock chamber of a cluster type apparatus according to an embodiment of the present invention.

FIG. 4 is an exploded perspective view showing a load-lock chamber of a cluster type apparatus according to an embodiment of the present invention.

In FIG. 4, a load-lock chamber 112 includes a chamber body 128 and a chamber lid 129. The chamber lid 129 includes a frame 152 and a plurality of plates 154. The frame 152 includes a first metallic material and each of the plurality of plates 154 includes a second metallic material having a lower strength and a higher heat conductivity than the first metallic material. In addition, the chamber body 128 includes the first metallic material. For example, the first metallic material may have stainless steel and the second metallic material may have aluminum (Al). Since the frame 152 and the chamber body 128 include the first metallic material having a relatively high strength, deformation of the load-lock chamber 112 is prevented. Further, since the plurality of plates 154 includes the second metallic material having a relatively high heat conductivity, the load-lock chamber 112 is effectively cooled down.

The chamber body 128 includes first to fourth sidewalls 130, 132, 134 and 136. The first and second sidewalls 130 and 132 have first and second slot valves 131 and 133, respectively, for transfer of the substrate 120 (of FIG. 3), and the third and fourth sidewalls 134 and 135 are disposed between the first and second sidewalls 130 and 132. As a result, the substrate 120 is inputted from the substrate loader/unloader 118 (of FIG. 3) into the load-lock chamber 112 through the first slot valve 131, and the substrate 120 is outputted from the load-lock chamber 12 to the transfer chamber 114 (of FIG. 3) through the second slot valve 133. Each of third and fourth sidewalls 136 and 138 has a view port 138 for inspecting the inside of the load-lock chamber 112. The view port 138 may be opened for inspection and may be closed after inspection.

Further, a diffuser 140 is formed on one of the third and fourth sidewalls 136 and 138. The load-lock chamber 112 of a vacuum state is ventilated by an inactive gas injected through the diffuser 140 to have an atmospheric state. For example, one of a nitrogen gas (N2) and an inert gas of helium (He), neon (Ne) or argon (Ar) may be diffused into the load-lock chamber 112 through the diffuser 140. A vacuum pump 999 is connected to the load-lock chamber 112 for obtaining the vacuum state. In addition, a plurality of substrate supporters 142 spaced apart from each other are formed in the load-lock chamber 112. The substrate 120 is loaded on the plurality of substrate supporters 142 and arms of the second robot 122 of the transfer chamber 114 are inserted into the spaces between the adjacent substrate supporters 142. Accordingly, the substrate 120 is transferred from the load-lock chamber 112 to the transfer chamber 114 using the second robot 122 through the second slot valve 133. The plurality of substrate supporters 142 may include a heating means (not shown) for heating up the substrate 120. While the substrate 120 is heated up, the load-lock chamber 112 is also heated up by the heating means.

Figure 5:
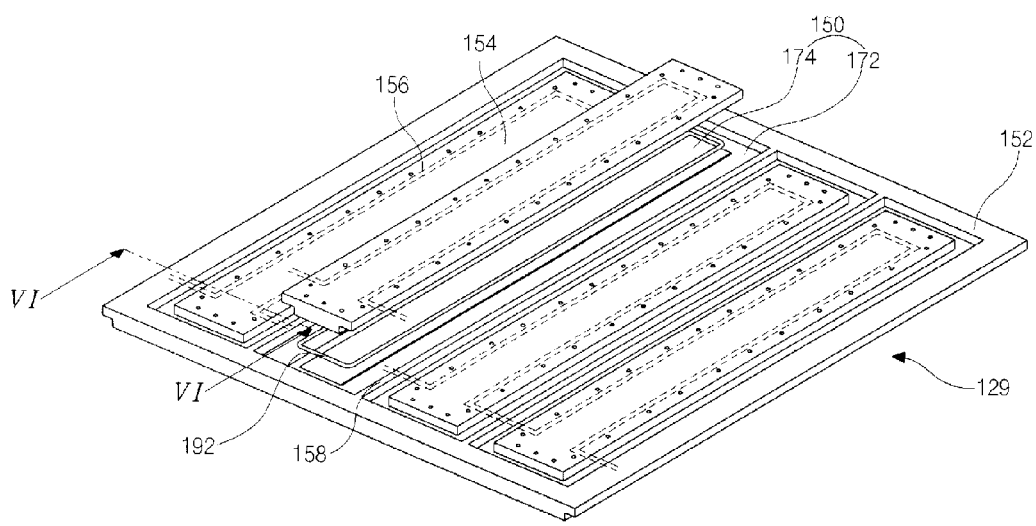
FIG. 5 is an exploded perspective view showing a chamber lid of a load-lock chamber of a cluster type apparatus according to an embodiment of the present invention
Figure 6:
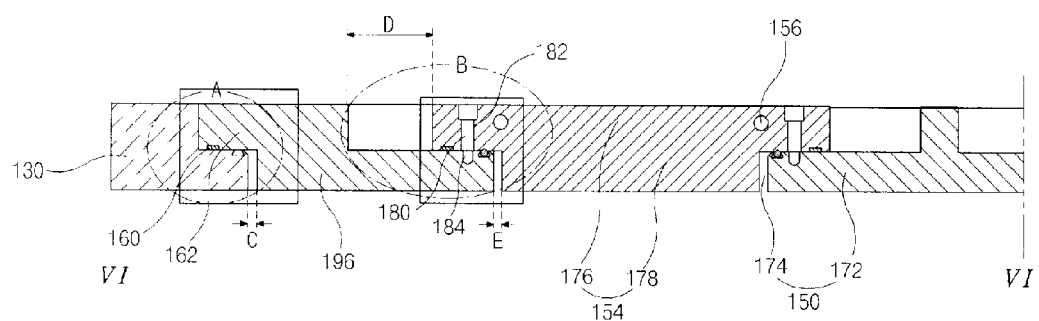
FIG. 6 is a cross-sectional view taken along a line VI-VI of FIG. 5.

FIG. 5 is an exploded perspective view showing a chamber lid of a load-lock chamber of a cluster type apparatus according to an embodiment of the present invention, and FIG. 6 is a cross-sectional view taken along a line VI-VI of FIG. 5.

In FIGS. 4 to 6, the chamber lid 129 combined with the first to fourth sidewalls 130, 132, 134 and 136 of the chamber body 128 includes the frame 152 and the plurality of plates 154. The frame 152 includes a plurality of openings 150, and the plurality of plates 154 are disposed in the plurality of openings 150, respectively. The frame 152 includes the first metallic material, e.g., stainless steel, having a relatively high strength and each of the plurality of plates 154 includes the second metallic material, e.g., aluminum (Al) having a relatively high heat conductivity.

The frame 152 further includes an edge portion 162 and a central portion 196 where the plurality of openings 150 are formed. The edge portion 162 is combined with the first to fourth sidewalls 130, 132, 134 and 136 of the chamber body 128, and the central portion 196 is inserted into a space constituted by the first to fourth sidewalls 130, 132, 134 and 136. As a result, the edge portion 162 contacts the first to fourth sidewalls 130, 132, 134 and 136 of the chamber body 128, and the plurality of plates 154 are spaced apart from the first to fourth sidewalls 130, 132, 134 and 136 of the chamber body 128.

The load-lock chamber 112 is evacuated for conversion from the atmospheric state to the vacuum state and is ventilated for conversion from the vacuum state to the atmospheric state. Accordingly, evacuation and ventilation are repeatedly performed for the load-lock chamber 112. Since the first to fourth sidewalls 130, 132, 134 and 136 and the frame 152 of the chamber lid 129 include the first metallic material having a relatively high strength, deformation of the load-lock chamber 112 is prevented even when evacuation and ventilation are repeated.

Each of the plurality of plates 154 includes a first flow channel 156 and the frame 152 includes through a second flow channel 158. When the plurality of plates 154 are combined with the frame 152, the first flow channel 156 in each of the plurality of plates 154 may be connected to the second flow channel 158 in the frame 152 using a connecting means such as a VCR fitting or a Swagelok fitting, and a refrigerant such as a cooling water flows through the first and second flow channels 156 and 158. Alternatively, the first and second flow channels 156 and 158 may not be connected to each other and a refrigerant may flow through the first and second flow channels 156 and 158 independently. Since each of the plurality of plates 154 includes the second metallic material having a relatively high heat conductivity, the heat of the load-lock chamber 112 is effectively transmitted to the refrigerant. As a result, the load-lock chamber 112 is effectively cooled down and deformation of the load-lock chamber 112 due to the heat is prevented even when the load-lock chamber 112 is heated up by the heating means.

As shown in FIG. 6, the edge portion 162 of the chamber lid 126 is combined with a top portion 160 of the first sidewall 130 of the chamber body 128. The top portion 160 and the edge portion 162 include first and second protrusions, respectively, and the second protrusion of the edge portion 162 is supported by the first protrusion of the top portion 160. In another embodiment, additional load-lock chambers may be disposed on the load-lock chamber so that a plurality of substrates can be transferred through the plurality of load-lock chambers at the same time.

Figure 7:
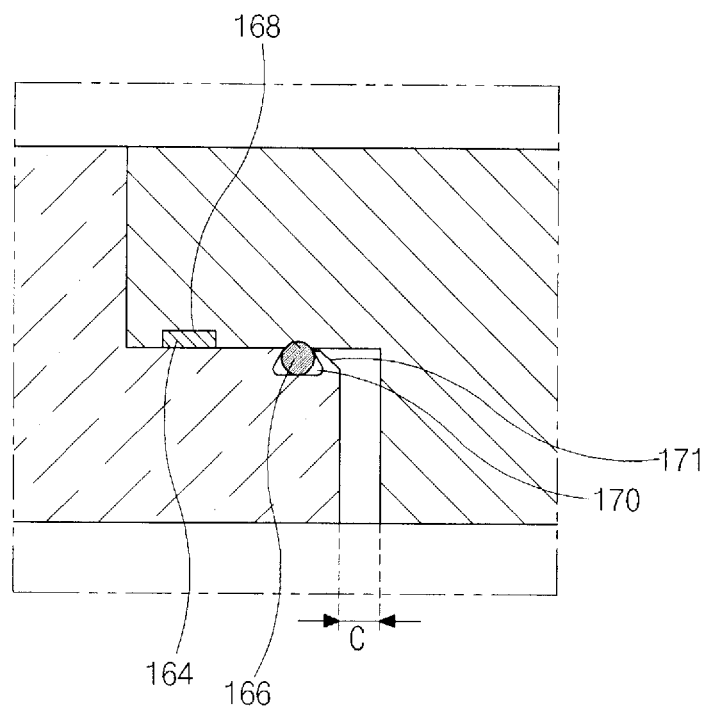
FIGS. 7 and 8 are magnified views of portions A and B, respectively, of FIG. 6.
Figure 8:
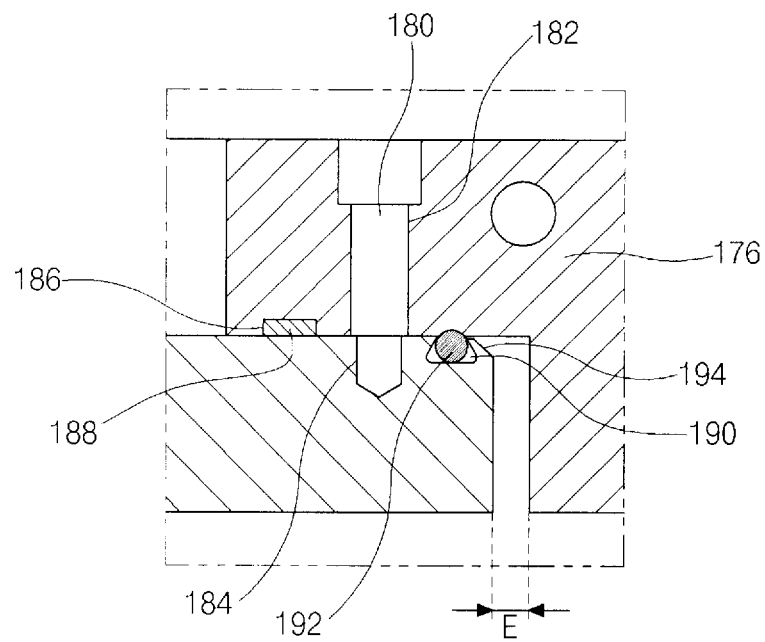

FIGS. 7 and 8 are magnified views of portions A and B, respectively, of FIG. 6.

In FIGS. 6 and 7, a first pad 164 and a first sealing means 166 are disposed between the first protrusion of the top portion 160 and the second protrusion of the edge portion 162. In addition, the top portion 160 of the first sidewall 130 is combined with the edge portion 162 of the frame 152 using a coupling means such as a bolt. Since the load-lock chamber 112 experiences the vacuum state and the atmospheric state repeatedly, particles may be generated due to friction between the chamber body 128 and the chamber lid 129. The friction between the first protrusion of the top portion 160 and the second protrusion of the edge portion 162 is mitigated by the first pad 164 and generation of the particles is prevented. The first pad 164 may include an engineering plastic such as Teflon. In addition, the air path between the first protrusion of the top portion 160 and the second protrusion of the edge portion 162 is sealed with the first sealing means 166 such as an O-ring.

The first protrusion of the top portion 160 includes a first groove 170 and the second protrusion of the edge portion 162 includes a second groove 168. As a result, the first groove 170 is formed on the top portions 160 of the first to fourth sidewalls 130, 132, 134 and 136 as a rectangular ring shape, and the second groove 168 is formed on the edge portion 162 of the frame 152 as a rectangular ring shape. The first sealing means 166 is inserted into the first groove 170, and the first pad 164 is inserted into the second groove 168. In a cross-sectional view, the first groove 170 may have an inverted trapezoid shape and the second groove 168 may have a rectangular shape. Further, the first protrusion of the top portion 160 may have a first rounded surface 171 by a chamfering method. The side surface of the top portion 160 of the first sidewall 130 is spaced apart from the side surface of the edge portion 162 of the frame 152 by a first gap distance C for effectively coupling the chamber body 128 and the chamber lid 129 without abrasion and providing a space accommodating thermal expansion of the chamber body 128 and the chamber lid 129. For example, the first gap distance C may be within a range of about 5 mm to about 15 mm, preferably, about 10 mm.

In FIGS. 6 and 8, each of the plurality of openings 150 includes a hanging portion 172 and an open portion 174, and each of the plurality of plates 154 includes an upper portion 176 and a lower portion 178. The upper portion 176 is supported by the hanging portion 172 and the lower portion 178 is inserted into the open portion 174. The hanging portion 172 and the upper portion 176 may be combined with each other by a plurality of coupling means 180 such as a bolt. Further, a plurality of through holes 182 are formed at a perimeter of the upper portion 176, and a plurality of coupling holes 184 are formed in the hanging portion 172.

A second pad 188 and a second sealing means 192 are disposed between the upper portion 176 and the hanging portion 172. For example, the second pad 188 may be disposed outside the plurality of coupling means 184 and the second sealing means 192 may be disposed inside the plurality of coupling means 184. In addition, the upper portion 176 includes a third groove 186 and the hanging portion 172 includes a fourth groove 190. The second pad 188 is inserted into the third groove 186, and the second sealing means 192 is inserted into the fourth groove 190. In a cross-sectional view, the third groove 186 may have a rectangular shape and the fourth groove 190 may have an inverted trapezoid shape. Further, the hanging portion 172 may have a second rounded surface 194 by a chamfering method.

The friction between the upper portion 176 and the hanging portion 172 is mitigated by the second pad 188 and generation of particles due to the friction is prevented. The second pad 188 may include an engineering plastic such as Teflon. Further, the air path between the upper portion 176 of each plate 154 and the hanging portion 172 of each opening 150 is sealed with the second sealing means 192 such as an O-ring.

The side surface of the upper portion 176 is spaced apart from the boundary side surface of each opening 150 by a second gap distance D for coupling each plate 154 and the frame 152 effectively and reducing the weight of the chamber lid 129. For example, the second gap distance D may be within a range of about 50 mm to about 150 mm, preferably, about 100 mm. In addition, the side surface of the hanging portion 172 is spaced apart from the side surface of the lower portion 178 by a third gap distance E for effectively coupling the chamber body 128 and the chamber lid 129 without abrasion and providing a space accommodating thermal expansion of the chamber body 128 and the chamber lid 129. For example, the first gap distance C may be within a range of about 5 mm to about 15 mm, preferably, about 10 mm.

Although the plurality of plates are combined with the frame using the coupling means in FIGS. 4 to 8, the plurality of plates may be welded into the frame (illustrated by optional. 998, of FIG. 4) without the second pad and the second sealing means in another embodiment. Furthermore, the chamber lid may be applied to the process chamber for preventing deformation in another embodiment.

In a cluster type apparatus according to the present invention, consequently, since the chamber lid includes the frame of the first metallic material having a relatively high strength and the plurality of plates of the second metallic material having a relatively high heat conductivity, deformation of the chamber lid due to repetition of the vacuum state and the atmospheric state is prevented. In addition, since the frame and the plurality of plates include flow channels for the refrigerant, deformation of the chamber lid due to the heat is prevented.

It will be apparent to those skilled in the art that various modifications and variations can be made in a vacuum chamber for processing a substrate and an apparatus including the vacuum chamber of the present invention without departing from the spirit or scope of the invention. Thus, it is intended that the present invention cover the modifications and variations of this invention provided they come within the scope of the appended claims and their equivalents.

What is claimed is:

1. A vacuum chamber for processing a substrate, comprising:
   a chamber body; and
   a chamber lid combined with the chamber body,
   wherein the chamber lid comprises:
      a frame having a plurality of openings; and
      a plurality of plates combined with the plurality of openings, each of the plurality of plates having a higher heat conductivity than the frame,
   wherein each of the plurality of openings includes a hanging portion and an open portion, and wherein each of the plurality of plates includes an upper portion supported by the hanging portion and a lower portion inserted into the open portion.

2. The vacuum chamber according to claim 1, wherein the frame includes a first metallic material and each of the plurality of plates includes a second metallic material having a lower strength than the first metallic material.

3. The vacuum chamber according to claim 2, wherein the chamber body includes the first metallic material, and the first metallic material includes a stainless steel and the second metallic material includes an aluminum.

4. The vacuum chamber according to claim 1, wherein the chamber body includes a plurality of sidewalls constituting a top portion having a first protrusion, wherein the frame includes an edge portion having a second protrusion and a central portion, wherein the edge portion is combined with the top portion such that the second protrusion is supported by the first protrusion and the central portion is inserted into a space formed by the plurality of sidewalls, and wherein a first pad and a first sealing means are disposed between the first and second protrusions.

5. The vacuum chamber according to claim 4, wherein the first and second protrusions include first and second grooves, respectively, and wherein the first pad is inserted into the second groove and the first sealing means is inserted into the first groove.

6. The vacuum chamber according to claim 4, wherein the first pad includes a Teflon and the first sealing means includes an O-ring.

7. The vacuum chamber according to claim 4, wherein a side surface of the top portion is spaced apart from a side surface of the edge portion.

8. The vacuum chamber according to claim 1, wherein the hanging portion and the upper portion are combined with each other by a plurality of bolts, and wherein a second pad and a second sealing means are disposed between the hanging portion and the upper portion.

9. The vacuum chamber according to claim 8, wherein the upper portion includes a third groove and the hanging portion includes a fourth groove, and wherein the second pad is inserted into the third groove and the second sealing means is inserted into the fourth groove.

10. The vacuum chamber according to claim 8, wherein the plurality of bolts are disposed between the second pad and the second sealing means.

11. The vacuum chamber according to claim 1, wherein a side surface of the upper portion is spaced apart from a boundary side surface of each of the plurality of openings by a first gap distance.

12. The vacuum chamber according to claim 11, wherein the first gap distance is within a range of about 50 mm to about 150 mm.

13. The vacuum chamber according to claim 1, wherein a side surface of the hanging portion is spaced apart from a side surface of the lower portion by a second gap distance.

14. The vacuum chamber according to claim 13, wherein the second gap distance is within a range of about 5 mm to about 15 mm.

15. The vacuum chamber according to claim 1, wherein each of the plurality of plates includes a first flow channel and the frame includes a second flow channel connected to the first flow channel, and wherein a refrigerant flows through the first and second flow channels.

16. The vacuum chamber according to claim 1, wherein the plurality of plates are welded into the frame.

17. The vacuum chamber according to claim 1, further comprising a plurality of substrate supporters in the chamber body.

18. The vacuum chamber according to claim 1, further comprising a vacuum pump connected to the chamber body for obtaining a vacuum state and a diffuser in the chamber body for obtaining an atmospheric state.

19. The vacuum chamber according to claim 1, wherein the vacuum chamber is one of a load-lock chamber and a process chamber.

* * * * *